United States Patent
Zhang et al.

(10) Patent No.: US 11,568,821 B2
(45) Date of Patent: Jan. 31, 2023

(54) ARRAY SUBSTRATE AND METHOD FOR MANUFACTURING SAME AND METHOD FOR CONTROLLING SAME, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Chaoqun Zhang, Beijing (CN); Yuqing Yang, Beijing (CN); Xiping Li, Beijing (CN); Jiajian Guan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 314 days.

(21) Appl. No.: 16/982,080

(22) PCT Filed: Oct. 24, 2019

(86) PCT No.: PCT/CN2019/113025
§ 371 (c)(1),
(2) Date: Sep. 18, 2020

(87) PCT Pub. No.: WO2021/077355
PCT Pub. Date: Apr. 29, 2021

(65) Prior Publication Data
US 2022/0293059 A1    Sep. 15, 2022

(51) Int. Cl.
*G09G 3/3266* (2016.01)
*H01L 27/32* (2006.01)
*G11C 19/28* (2006.01)

(52) U.S. Cl.
CPC ....... *G09G 3/3266* (2013.01); *H01L 27/3276* (2013.01); *G09G 2300/0408* (2013.01);
(Continued)

(58) Field of Classification Search
CPC ......... G09G 3/3266; G09G 2300/0408; G09G 2300/0426; G09G 2300/0413;
(Continued)

(56) References Cited

U.S. PATENT DOCUMENTS

2019/0305057 A1* 10/2019 Cheng .................. H01L 51/5036
2020/0294450 A1*  9/2020 Kim ....................... G09G 3/3266
2020/0302876 A1*  9/2020 Shin ....................... G09G 3/3677

FOREIGN PATENT DOCUMENTS

CN      108470753 A     8/2018
CN      109166470 A     1/2019
(Continued)

OTHER PUBLICATIONS

International search report of PCT application No. PCT/CN2019/113025 dated Aug. 3, 2020.

*Primary Examiner* — Doon Y Chow
(74) *Attorney, Agent, or Firm* — Fay Sharpe LLP

(57) ABSTRACT

A array substrate includes: a first sub-pixel, a second sub-pixel and a dummy sub-pixel that are located in a display region; a luminance attenuation degree of the first sub-pixel is greater than that of the second sub-pixel along a target direction; and a light-emitting layer of the dummy sub-pixel is configured to emit light having a color the same as that of light emitted by the first sub-pixel. As the dummy sub-pixel further includes the connecting electrode electrically connecting the pixel circuit with the light-emitting layer of the dummy sub-pixel the luminance attenuation of the first sub-pixel may be effectively compensated by driving the dummy sub-pixel to emit light.

17 Claims, 13 Drawing Sheets

(52) U.S. Cl.
CPC ............ *G09G 2300/0413* (2013.01); *G09G 2300/0426* (2013.01); *G09G 2300/0443* (2013.01); *G09G 2300/0452* (2013.01); *G09G 2310/0286* (2013.01); *G09G 2320/0233* (2013.01); *G11C 19/28* (2013.01); *H01L 27/3213* (2013.01); *H01L 27/3223* (2013.01); *H01L 2227/323* (2013.01)

(58) Field of Classification Search
CPC ... G09G 2300/0443; G09G 2300/0452; G09G 2310/0286; G09G 2320/0233; H01L 27/3276; H01L 27/3213; G11C 19/28
See application file for complete search history.

(56) References Cited

FOREIGN PATENT DOCUMENTS

| | | |
|---|---|---|
| CN | 109697952 A | 4/2019 |
| CN | 110289295 A | 9/2019 |
| JP | 2010186118 A | 8/2010 |

\* cited by examiner

Sequentially forming a pixel circuit structure, a drive electrode structure, a light-emitting layer structure and an electrode layer structure in a display region of a base substrate to obtain a first sub-pixel, a second sub-pixel and a dummy sub-pixel — 170

FIG. 17

Forming a gate pattern, an active layer pattern and a source and drain electrode pattern on a side of the base substrate to obtain the pixel circuit structure — 1701

Forming the drive electrode structure on a side, away from the base substrate, of the gate pattern, the active layer pattern and the source and drain electrode pattern — 1702

Forming the light-emitting layer structure on a side of the drive electrode structure away from the base substrate — 1703

Forming the electrode layer structure on a side of the light-emitting layer structure away from the base substrate — 1704

FIG. 18

Providing a drive signal for a pixel circuit of a dummy sub-pixel, wherein the pixel circuit of the dummy sub-pixel drives the light-emitting layer of the dummy sub-pixel to emit light through the connecting electrode of the dummy sub-pixel in response to the drive signal — 230

FIG. 23

Providing a control signal for the control signal end, wherein the switch circuit controls two conductive segments electrically connected to the switch circuit to be on in response to the control signal — 2301

Providing a data signal for a data line, providing a power signal for a power signal line, providing a compensation signal for a first GOA unit, and providing a compensation signal for a first EOA unit — 2302

FIG. 24

ARRAY SUBSTRATE AND METHOD FOR MANUFACTURING SAME AND METHOD FOR CONTROLLING SAME, AND DISPLAY APPARATUS

CROSS-REFERENCE TO RELATED APPLICATION

This application is a 371 of PCT Application No. PCT/CN2019/113025, filed on Oct. 24, 2019, the entire contents of which are incorporated herein by reference.

TECHNICAL FIELD

The present disclosure relates to the technical field of display, more particularly, to an array substrate and a method for manufacturing the same and a method for controlling the same, and a display apparatus.

BACKGROUND

With the development of the display technologies, a display screen of the display apparatus is no longer restricted to the original bezel-less design, and a series of special-shaped screens having the notch are emerging.

SUMMARY

In one aspect, the present disclosure provides an array substrate, including a base substrate, and a first sub-pixel, a second sub-pixel and a dummy sub-pixel that are located in a display region of the base substrate; the display region is provided with a notch; and a luminance attenuation degree of the first sub-pixel is greater than that of the second sub-pixel in a target direction from a center of the display region to a place close to the notch; and each sub-pixel includes a pixel circuit, a connecting electrode, a light-emitting layer and an electrode layer; the light-emitting layer is electrically connected to the pixel circuit through the connecting electrode; the light-emitting layer is further electrically connected to the electrode layer; the pixel circuit is configured to drive the light-emitting layer to emit light through the connecting electrode; and a light-emitting layer in the dummy sub-pixel and a light-emitting layer in the first sub-pixel are configured to emit light having a same color.

In another aspect, the present disclosure provides a method for manufacturing an array substrate, including:

sequentially forming a pixel circuit structure, a drive electrode structure, a light-emitting layer structure and an electrode layer structure in a display region of a base substrate to obtain a first sub-pixel, a second sub-pixel and a dummy sub-pixel, wherein the pixel circuit structure includes: a pixel circuit of each sub-pixel, the drive electrode structure includes a connecting electrode of each sub-pixel, the light-emitting layer structure includes a light-emitting layer of each sub-pixel, the electrode layer structure includes an electrode layer of each sub-pixel, and in each sub-pixel, the light-emitting layer is electrically connected to the pixel circuit through the connecting electrode, the light-emitting layer is further electrically connected to the electrode layer, and the pixel circuit is configured to drive the light-emitting layer to emit light through the connecting electrode; and the display region is provided with a notch; a luminance attenuation degree of the first sub-pixel is greater than that of the second sub-pixel in a target direction from a center of the display region to a place close to the notch; and a light-emitting layer of the dummy sub-pixel and a light-emitting layer of the first sub-pixel are configured to emit light having a same color.

In still another aspect, the present disclosure provides a method for driving an array substrate in the above aspect, and including:

providing a drive signal for the pixel circuit of the dummy sub-pixel, the pixel circuit of the dummy sub-pixel drives the light-emitting layer of the dummy sub-pixel to emit light through the connecting electrode of the dummy sub-pixel in response to the drive signal.

In still another aspect, the present disclosure provides an apparatus for controlling an array substrate, the control apparatus is electrically connected to a pixel circuit of a dummy sub-pixel, and the control apparatus is configured to execute the method for driving the array substrate in the above aspect.

In still another aspect, the present disclosure provides a display apparatus, including the array substrate in the above aspect, and the apparatus for controlling the array substrate in the above aspect.

BRIEF DESCRIPTION OF THE DRAWINGS

In order to more clearly describe the technical solutions of the embodiments of the present disclosure, the accompanying drawings required to describe the embodiments are briefly, described below. Apparently, the accompanying drawings described below are only some embodiments of the present disclosure. Those of ordinary skill in the art may further obtain other accompanying drawings based on these accompanying drawings without inventive effort.

FIG. 17 is a flowchart of a method for manufacturing an array substrate provided by an embodiment of the present disclosure;

FIG. 18 is a flowchart of a method for manufacturing another array substrate provided by an embodiment of the present disclosure;

FIG. 23 is a flowchart of a method for driving an array substrate provided by an embodiment of the present disclosure; and FIG. 24 is a flowchart of a method for driving another array substrate provided by an embodiment of the present disclosure.

DETAILED DESCRIPTION

To make the objectives, technical solutions, and advantages of the present disclosure clearer, the implementation manners of the present disclosure are described below in detail with reference to the accompanying drawings.

Transistors adopted in all embodiments of the present disclosure may be thin film transistors or field-effect transistors or other devices with the same characteristics, and the transistors adopted in the embodiments of the present disclosure are mainly switching transistors according to the effect in the circuit. The source and the drain of each switching transistor used herein are symmetrical, so the source and the drain are interchangeable. In the embodiments of the present disclosure, the source is referred to as the first pole and the drain is referred to as the second pole, or the drain is referred to as the first pole and the source is referred to as the second pole. According to the forms in the accompanying drawings, the intermediate section of the transistor serves as the gate, the signal input end serves as the source, and the signal output end serves as the drain. In addition, the switching transistor used in the embodiments of the present disclosure may include either a P-type switching transistor or an N-type switching transistor. The P-type switching transistor is on when the gate is at the low level and the P-type switching transistor is off when the gate is at the high level. The N-type switching transistor is on when the gate is at the high level and the N-type switching transistor is off when the gate is at the low level. Besides, a plurality of signals in each embodiment of the present disclosure respectively, correspond to a first potential and a second potential. The first potential and the second potential merely represent that the potential of the signal has two different states, rather than that the first potential or the second potential in the whole specification has a special value.

Figure 1:
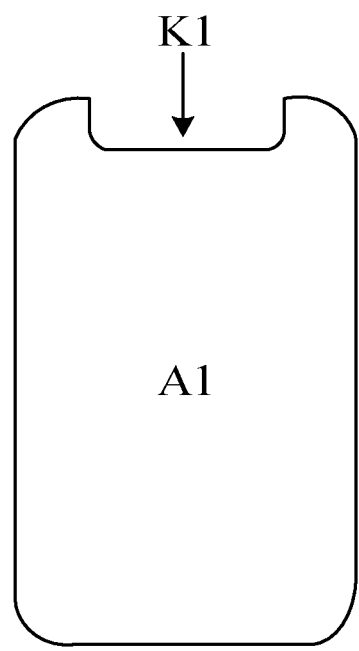
FIG. 1 is a schematic structural diagram of a special-shaped screen provided by an embodiment of the present disclosure.

A special-shaped screen provided with a notch on at least one side of a display region has become a mainstream design in the technical field of display now. Exemplarily, FIG. 1 is a schematic structural diagram of a special-shaped screen provided by an embodiment of the present disclosure. Referring to FIG. 1, a notch K1 is provided on one side of a display region A1 of the special-shaped screen. The display region A1 includes a plurality of effective sub-pixels. One side, which is close to the notch K1, of the display region A1 and a non-display region, away from one side of the notch K1, include a plurality of dummy sub-pixels.

Figure 2:
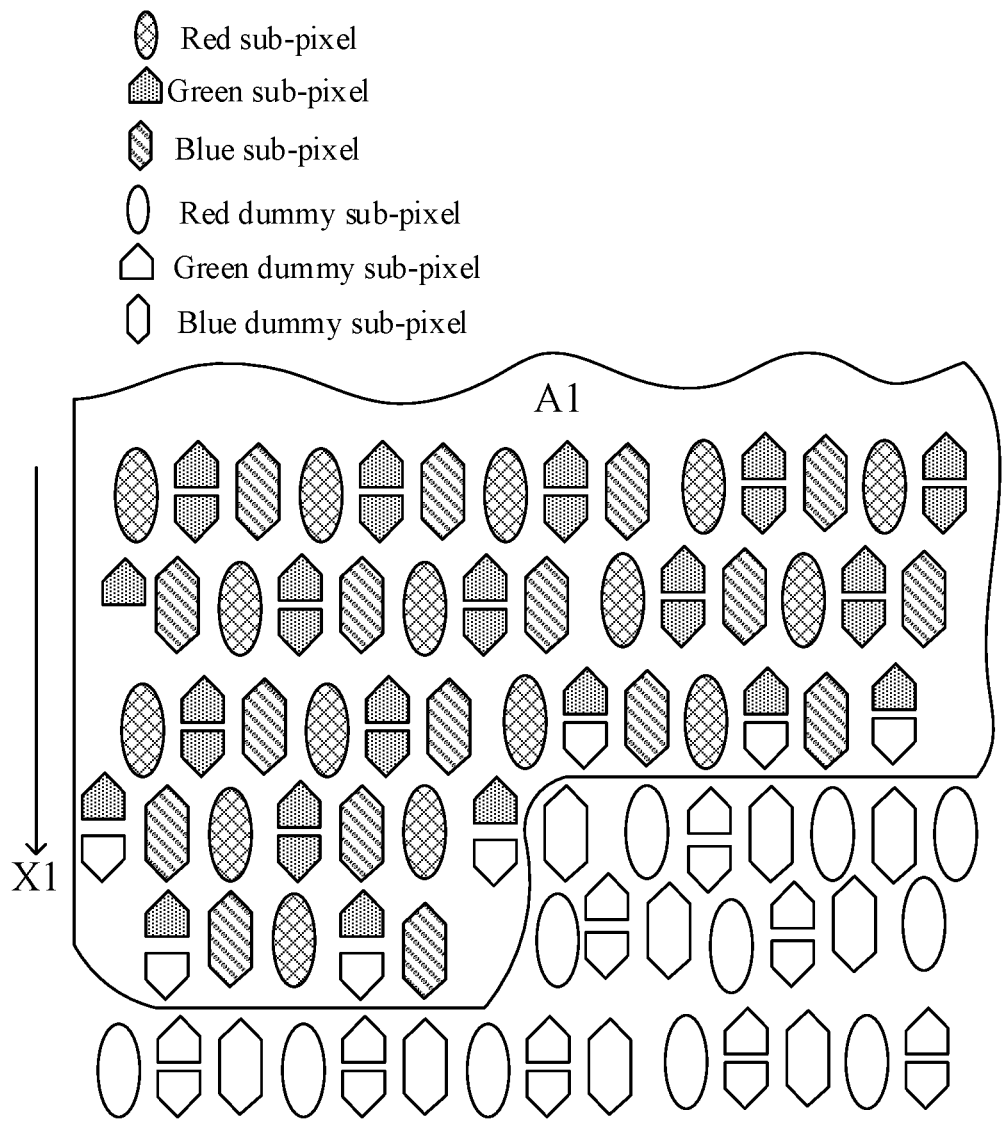
FIG. 2 is a schematic structural diagram of a special-shaped screen in the relevant art.

Referring to FIG. 2, the effective sub-pixels may include a red sub-pixel, a green sub-pixel and a blue sub-pixel, and the dummy sub-pixels may include a red dummy sub-pixel, a green dummy sub-pixel and a blue dummy sub-pixel. Each line of sub-pixels may be arranged in an RGGB manner, i.e., each line of sub-pixels may be arranged in an order of one red sub-pixel, two side-by-side arranged green sub-pixels and one blue sub-pixel. It is to be noted that setting the plurality of dummy sub-pixels can realize the protection of the effective sub-pixels and ensure the arrangement uniformity of the sub-pixels. Optionally, referring to FIG. 2, the green sub-pixel and the green dummy sub-pixel are of a pentagonal shape, the blue sub-pixel and the blue dummy sub-pixel are of a hexagonal shape, and the red sub-pixel and the red dummy sub-pixel are of an elliptical shape. An area of orthographic projections of the two side-by-side arranged green sub-pixels on a base substrate, an area of an orthographic projection of the red sub-pixel on the base substrate, and an area of an orthographic projection of the blue sub-pixel on the base substrate are the same. An area of orthographic projections of the two side-by-side arranged green dummy sub-pixels on the base substrate, an area of an orthographic projection of the red dummy sub-pixel on the base substrate, and an area of an orthographic projection of the blue dummy sub-pixel on the base substrate are the same.

Figure 3:
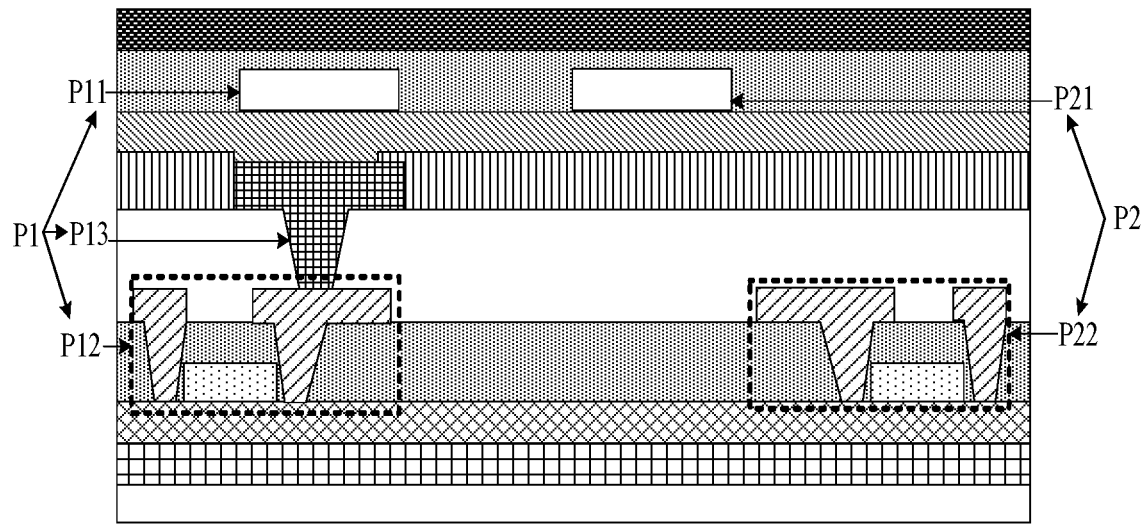
FIG. 3 is a schematic structural diagram of a substrate of a special-shaped screen in the relevant art.
Figure 4:
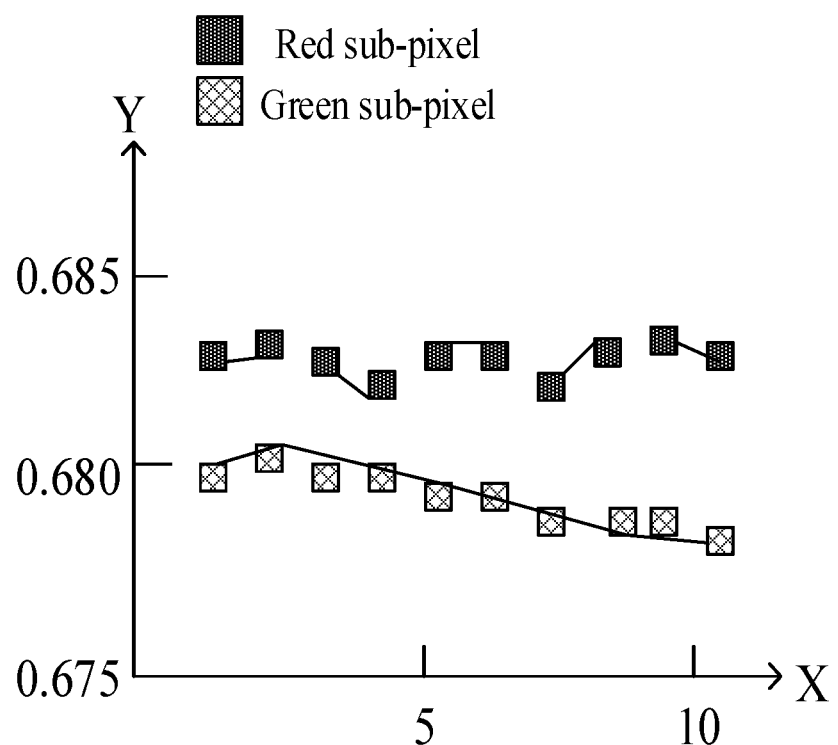
FIG. 4 is a schematic diagram of a test result provided by an embodiment of the present disclosure.
Figure 5:
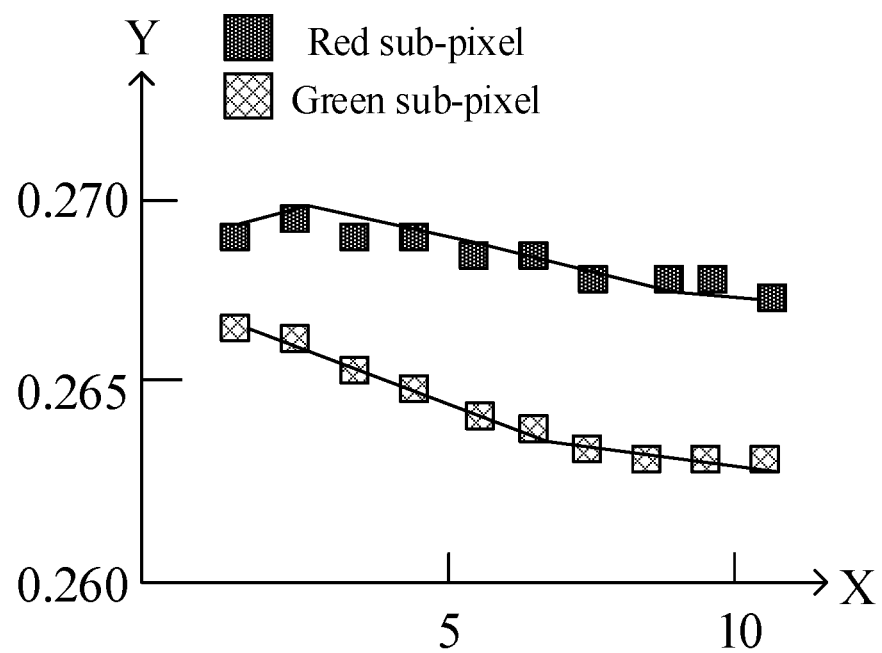
FIG. 5 is a schematic diagram of another test result provided by an embodiment of the present disclosure.
Figure 6:
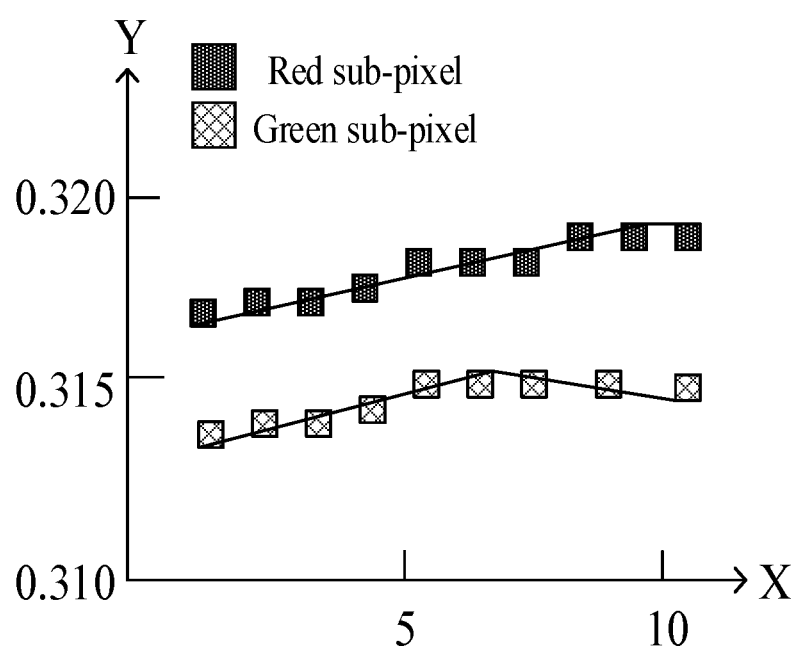
FIG. 6 is a schematic diagram of still another test result provided by an embodiment of the present disclosure.
Figure 7:
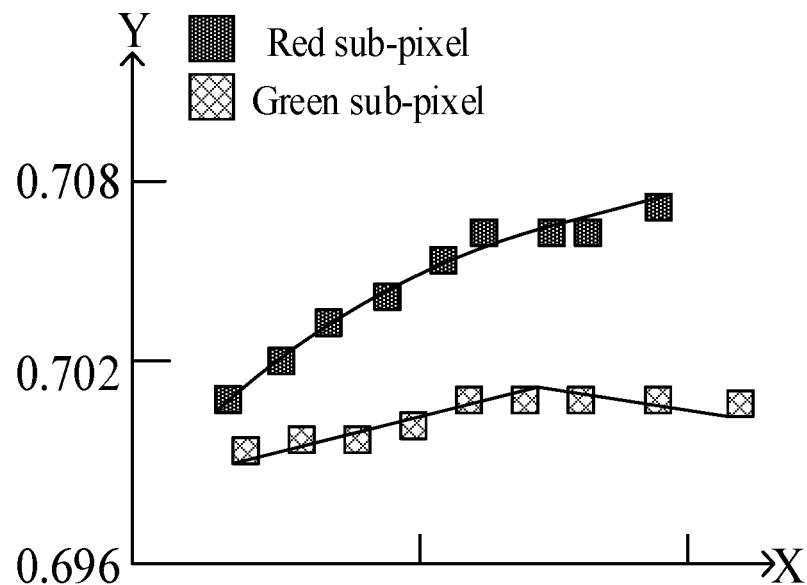
FIG. 7 is a schematic diagram of still another test result provided by an embodiment of the present disclosure.
Figure 8:
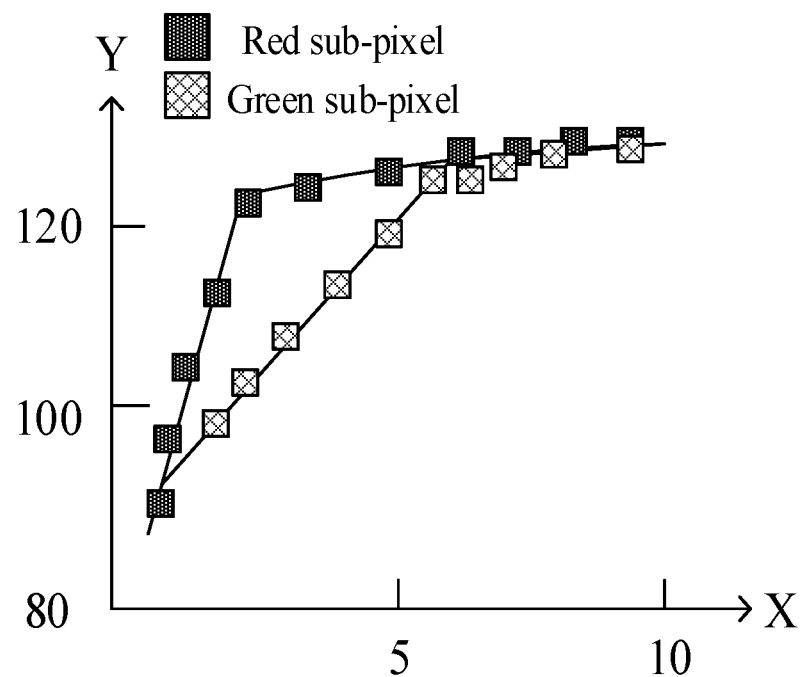
FIG. 8 is a schematic diagram of still another test result provided by an embodiment of the present disclosure.
Figure 9:
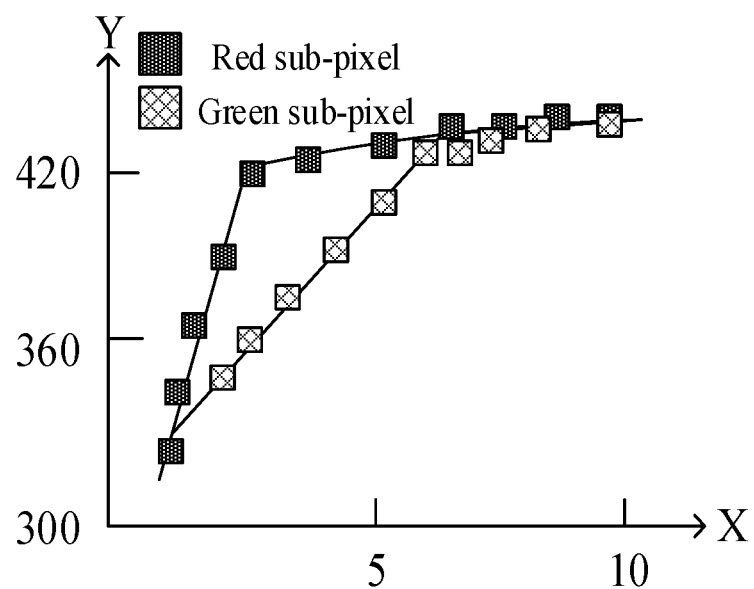
FIG. 9 is a schematic diagram of still another test result provided by an embodiment of the present disclosure.

In the relevant art, a pixel circuit and a light-emitting layer included in each effective sub-pixel are electrically connected, and each effective sub-pixel can serve as a display in use. Each dummy sub-pixel only includes a pixel circuit and a light-emitting layer, and the light-emitting layer is not electrically connected to the pixel circuit, i.e., the dummy sub-pixel of the special-shaped display apparatus in the relevant art does not serve as the display in use. Exemplarily, FIG. 3 takes adjacent effective green sub-pixel and dummy green sub-pixel as the example to describe a special-shaped array substrate in the relevant art. As shown in FIG. 3, the effective green sub-pixel P1 includes: a light-emitting layer P11, a pixel circuit P12, and a connecting electrode P13 electrically connected to the pixel circuit P12 and the light-emitting layer P11. The dummy green sub-pixel P2 only includes: a light-emitting layer P21 and a pixel electrode P22, and the light-emitting layer P21 is not electrically connected to the pixel electrode P22. Additionally, referring to FIG. 3, the array substrate further includes a plurality of insulating layers (not labeled in the figure).

Moreover, in order to drive each line of sub-pixels to emit light normally and ensure the arrangement uniformity, the special-shaped screen may further include a plurality of effective shift register GOA units, a plurality of effective shift register EOA units, a plurality of dummy GOA units and a plurality of dummy EOA units that are located on one side of the display region A1. The effective GOA units and the effective EOA units may be electrically connected to the pixel circuit of the effective sub-pixel, and are configured to provide a drive signal for the pixel circuit. The dummy GOA units and the dummy EOA units are not connected to any sub-pixel, i.e., the dummy GOA units and the dummy EOA units do not serve as a drive in use and do not make contributions for the display.

In the embodiment of the present disclosure, through Long Range Uniformity (LRU) test, i.e., luminance uniformity test, the following conclusions are drawn: combining with FIGS. 1 and 2, the luminance of each sub-pixel attenuates to different degrees along the target direction X1 from a center of the display region A1 to a place close to the notch K1. Correspondingly, the display color of the side close to the notch K1 is abnormal. For example, for the display screen having the RGGB arrangement shown in FIG. 2, the green sub-pixel has the attenuation degree L_G of 31% along the target direction X1, the red sub-pixel has the attenuation degree of 27% along the target direction X1, and the blue sub-pixel has the luminance attenuation degree L_B of 25% along the target direction X1. Comparing the luminance attenuation degrees of the three colors of sub-pixels, it can be determined that along the target direction X1, the luminance attenuation degree of the green sub-pixel is greater than that of the blue sub-pixel and the red sub-pixel. Correspondingly, the display color of the side close to the notch K1 is out-of-balance. For example, it is concluded by the test that the color component Gx of the red sub-pixel on the side close to the notch K1 is 0.0018, and the color component Rx of the green sub-pixel is 0.0002, i.e., the color component of the green sub-pixel is smaller than that of the red sub-pixel.

Exemplarily, FIG. 4 to FIG. 9 are respectively a schematic diagram of a test result of luminance test and color test on the display screen shown in FIG. 2 provided by an embodiment of the present disclosure. The color test takes the Commission Internationale de L'Eclairage (CIE) as the test standard. A horizontal ordinate in FIG. 4 to FIG. 9 refers to each sub-pixel point collected along the target direction X1. A vertical coordinate Y of the test result shown in FIG. 4 refers to the color component of the red sub-pixel in the X-axis direction of the CIE, the vertical coordinate Y of the test result shown in FIG. 5 refers to the color component of the green sub-pixel in the X-axis direction of the CIE, the vertical coordinate Y of the test result shown in FIG. 6 refers to the color component of the red sub-pixel in the Y-axis direction of the CIE, the vertical coordinate Y of the test result shown in FIG. 7 refers to the color component of the green sub-pixel in the Y-axis direction of the CIE, the vertical coordinate Y of the test result shown in FIG. 8 refers to the luminance value of the red sub-pixel, and the vertical coordinate Y of the test result shown in FIG. 9 refers to the luminance value of the green sub-pixel. As can be seen with reference to FIG. 4 to FIG. 9; along the target direction X1, the color component of the red sub-pixel in the X-axis direction and Y-axis direction of the CIE coordinate system gradually rises with a gentle change. The color component of the green sub-pixel in the X-axis direction of the CIE coordinate system gradually declines, and the color component in the Y-axis direction of the color coordinate system gradually rises with a prominent change, and the luminance attenuation degree of the red sub-pixel is obviously smaller than that of the green sub-pixel. Since when the luminance attenuation degree of the green sub-pixel is large, the overall display effect is slightly red. As a result, a phenomenon that the side close to the notch K1 of the special-shaped display apparatus provided in the relevant art is red is apt to appear.

An embodiment of the present disclosure provides an array substrate, which may solve the problem of poor display effect of the special-shaped screen display apparatus in the relevant art. It is to be noted that the non-dummy sub-pixels described in the following embodiment are all effective sub-pixels capable of emitting light normally, the non-dummy GOA units are all effective GOA units, the non-dummy EOA units are all effective EOA units, and the transistors of the pixel circuit included in the array substrate are all of a bottom-gate structure. Certainly, the transistors of the pixel circuit may also be of a top-gate structure, which are not described in the embodiment of the present disclosure thereto.

Figure 10:
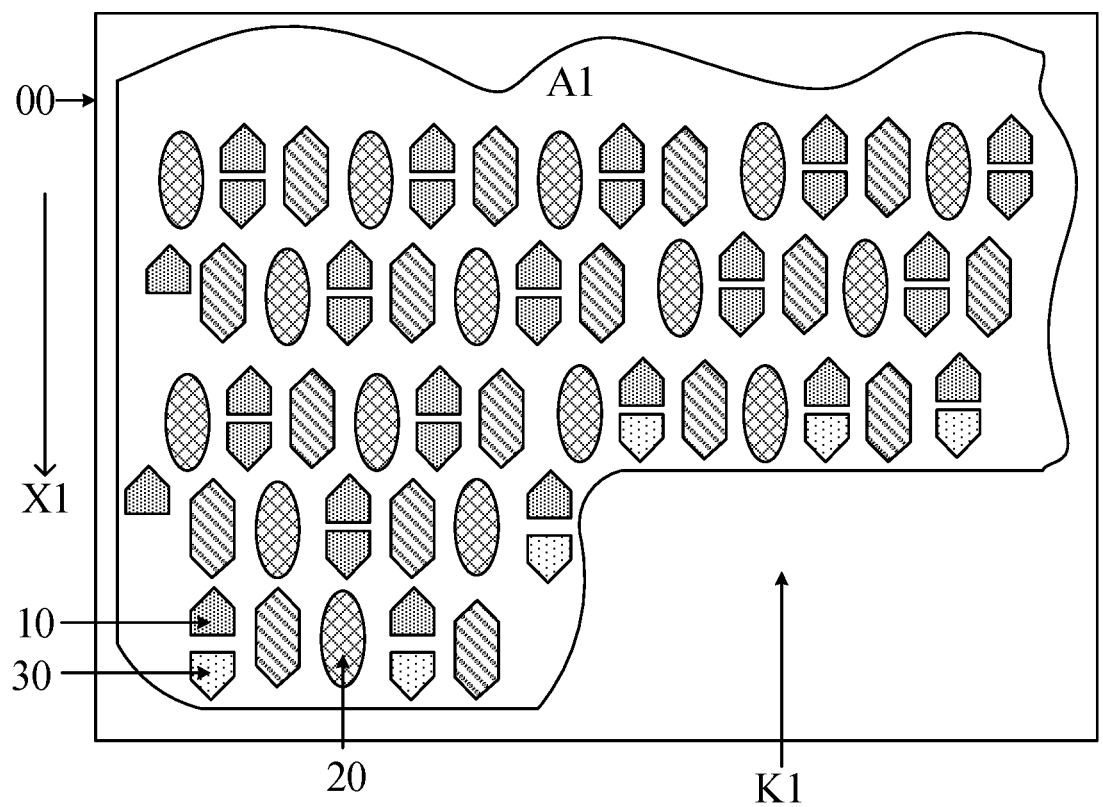
FIG. 10 is a schematic structural diagram of an array substrate provided by an embodiment of the present disclosure.

FIG. 10 is a schematic structural diagram of an array substrate provided by an embodiment of the present disclosure. As shown in FIG. 10, the array substrate may include a base substrate 00, and a first sub-pixel 10, a second sub-pixel 20 and a dummy sub-pixel 30 that are located in a display region A1 of the base substrate 00. Referring to FIG. 10, the display region A1 of the base substrate 00 is provided with a notch K1, and a luminance attenuation degree of the first sub-pixel 10 is greater than that of the second sub-pixel 20 along a target direction X1 from a center of the display region A1 to a place close to the notch K1.

Each sub-pixel may include a pixel circuit, a connecting electrode, a light-emitting layer and an electrode layer. For each sub-pixel, the light-emitting layer may be electrically connected to the pixel circuit through the connecting electrode, the light-emitting layer is further electrically, connected to the electrode layer, and the pixel circuit may drive the light-emitting layer to emit light by the connecting electrode. A light-emitting layer of the dummy sub-pixel 30 and a light-emitting layer of the first sub-pixel 10 may emit light having the same color. For example, supposing that the first sub-pixel 10 is the green sub-pixel, the light-emitting layer of the dummy sub-pixel 30 may emit green light.

Figure 11:
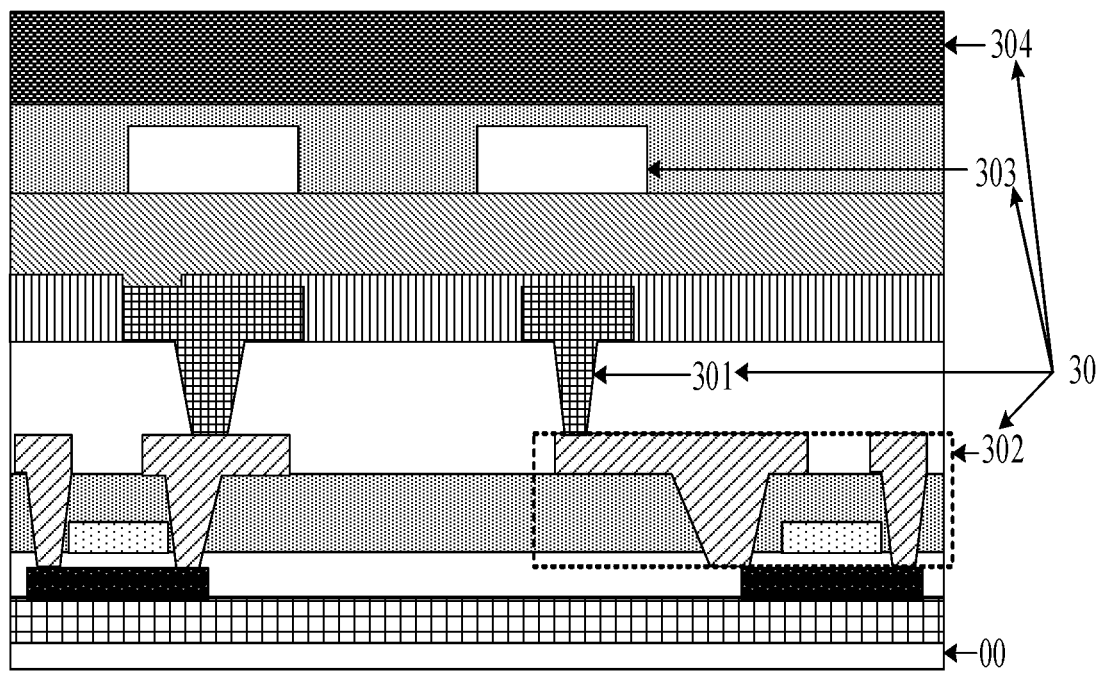
FIG. 11 is a schematic structural diagram of another array substrate provided by an embodiment of the present disclosure.

Optionally, referring to FIG. 11, the dummy sub-pixel 30 is used as an example, and the schematic structural diagram of another array substrate provided by the embodiment of the present disclosure is illustrated. As shown in FIG. 11, the dummy sub-pixel 30 may include a connecting electrode 301, a pixel circuit 302, a light-emitting layer 303 and an electrode layer 304. The light-emitting layer 303 may be electrically connected to the pixel electrode 302 through the connecting electrode 301, and the light-emitting layer 303 is further electrically connected to the electrode layer 304. The pixel electrode 302 may drive the light-emitting layer 303 to emit light by the connecting electrode 301.

Comparing FIG. 3 with FIG. 11, in the display region A1 of the array substrate provided by the embodiment of the present disclosure, the dummy sub-pixel 30 for emitting the light having the same color as the light emitted by the first sub-pixel further includes the connecting electrode 301. The connecting electrode 301 may be electrically connected to the pixel circuit 302 and the light-emitting layer 303 of the dummy sub-pixel 30. As a result, the embodiment of the present disclosure may compensate the luminance attenuation of the first sub-pixel 10 having a large luminance attenuation degree by driving the dummy sub-pixel 30 to emit light. That is, the difference in luminance attenuation between the effective sub-pixels (such as the first sub-pixel 10 and the second sub-pixel 20) is reduced by driving the dummy sub-pixel 30 to emit light. The display apparatus having the array substrate has the better display effect.

For example, it is assumed that the first sub-pixel 10 is the green sub-pixel, the second sub-pixel 20 is the red sub-pixel, the dummy sub-pixel 30 is the green dummy sub-pixel and the display region A1 further includes the blue sub-pixel. The difference in luminance attenuation among the three colors of sub-pixels may be effectively reduced by driving the dummy sub-pixel 30 to emit light. Correspondingly, the red display phenomenon due to the large luminance attenuation of the first sub-pixel may be effectively prevented.

In conclusion, the embodiment of the present disclosure provides the display substrate including the first sub-pixel, the second sub-pixel and the dummy sub-pixel. The luminance attenuation degree of the first sub-pixel is greater than that of the second sub-pixel in the target direction, and the light emitted by the light-emitting layer of the dummy sub-pixel has the same color as that of the light emitted by the first sub-pixel. The dummy sub-pixel further includes the connecting electrode for electrically connecting the pixel circuit with the light-emitting layer of the dummy sub-pixel, and the pixel circuit may drive the dummy sub-pixel to emit light by the connecting electrode. Therefore, the luminance attenuation of the first sub-pixel may be compensated by controlling the dummy sub-pixel to emit light, i.e., the difference in luminance attenuation between the first sub-pixel and the second sub-pixel may be reduced by controlling the dummy sub-pixel to emit light. The display apparatus having the array substrate has the better display effect.

Optionally, in the embodiment of the present disclosure, both the connecting electrode and the electrode layer may be the anode or the cathode for driving the light-emitting layer to emit light, and the connecting electrode may be different from the electrode layer. The following embodiment of the present disclosure takes that the connecting electrode serves as the anode and the electrode layer serves as the cathode for an example for description.

Figure 12:
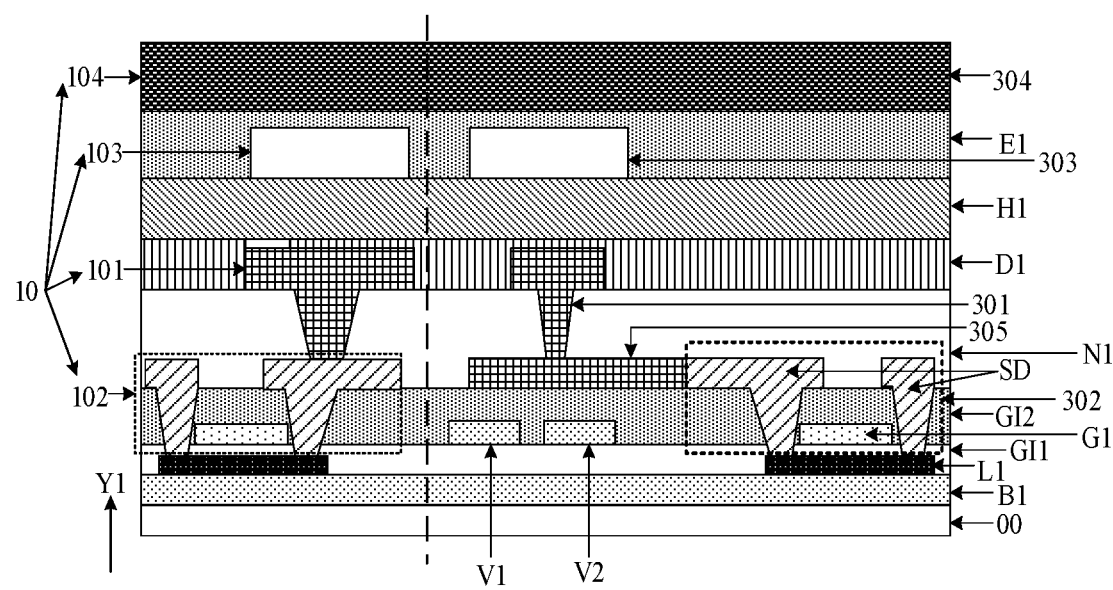
FIG. 12 is a schematic structural diagram of still another array substrate provided by an embodiment of the present disclosure.

FIG. 12 is a schematic structural diagram of still another array substrate provided by an embodiment of the present disclosure. As shown in FIG. 12, the connecting electrode 301 of the dummy sub-pixel 30 and the connecting electrode 101 of the first sub-pixel 10 may be located on the same layer. Correspondingly, the connecting electrode 301 and the connecting electrode 101 may be formed by a single patterning process, and the connecting electrode 301 and the connecting electrode 101 may be the electrodes of the same type. That is, if the connecting electrode 101 serves as the anode, the connecting electrode 301 serves as the anode; and if the connecting electrode 101 serves as the cathode, the connecting electrode 301 serves as the cathode. Therefore, the manufacturing cost and the complexity of the manufacturing process can be prevented from increasing.

Optionally, for each sub-pixel, the luminance of the light-emitting layer is in direct proportion to the effective area of the connecting electrode, and the effective area refers to an overlapping area between the orthographic projection of the connecting electrode on the base substrate and the orthographic projection of the light-emitting layer on the base substrate. That is, for each sub-pixel, the larger the effective area of the connecting electrode, the stronger the luminous intensity of the light-emitting layer; and the smaller the effective area of the connecting electrode, the weaker the luminous intensity.

Therefore, in the dummy sub-pixel 30, the area of the orthographic projection of the connecting electrode 301 on the base substrate 00 may be smaller than or equal to that of the orthographic projection of the light-emitting layer 303 on the base substrate 00. For example, referring to FIG. 12, for the dummy sub-pixel 30 in the array substrate provided by the embodiment of the present disclosure, the area of the orthographic projection of the connecting electrode 301 on the base substrate 00 is smaller than that of the orthographic projection of the light-emitting layer 303 on the base substrate 00. Moreover, the first sub-pixel 10 itself may emit light. Correspondingly, it is only required to control the luminance of the dummy sub-pixel 30 and the luminance attenuation of the first sub-pixel 10 may be compensated only by controlling. Therefore, with the arrangement manner in FIG. 12, the manufacturing cost may be reduced on the premise that the reliable compensation is realized.

It is to be noted that for different sizes and different light-emitting materials, the luminance attenuation degree of the first sub-pixel 10 may vary from each other. Correspondingly, the luminance to be compensated is different and the luminance of the light required to be emitted by the dummy sub-pixel 30 is also different. For example, with algorithm test, when the first sub-pixel 10 is the green sub-pixel and the dummy sub-pixel 30 is the green dummy sub-pixel, it is concluded in combination with the light-emitting material, film layer characteristic and luminance attenuation degree of the green sub-pixel that: a ratio of the area of the orthographic projection of the connecting electrode 301 of the dummy sub-pixel on the base substrate 00 to the area of the orthographic projection of the light-emitting layer 303 of the dummy sub-pixel 30 on the base substrate 00 may range from 7% to 15%. That is, when the area of the orthographic projection of the connecting electrode 301 on the base substrate 00 meets the ratio range, the luminance attenuation of the first sub-pixel 10 may be compensated effectively and reliably.

It is further to be noted that the control of luminance of the light-emitting layer 303 of the dummy sub-pixel 30 is realized by adjusting the effective area of the connecting electrode 301 of the dummy sub-pixel 30 in the above descriptions. Additionally, the luminance of each sub-pixel is further relevant to the voltage of the signal (such as the data signal Vdata) provided by the pixel circuit. Therefore, for the dummy sub-pixel 30, a flexible adjustment to the luminance of the light-emitting layer 303 may be realized by further controlling the voltage of the signal provided by the pixel circuit 302.

Optionally, as a certain spacing may be present between the pixel circuit 302 and the light-emitting layer 303 in the dummy sub-pixel 30 in combination with FIG. 12, in order to implement the reliable electrical connection between the pixel circuit 302 and the light-emitting layer 303, the array substrate may further include an auxiliary electrode 305, referring to FIG. 12. The auxiliary electrode 305 and the connecting electrode 301 may be sequentially arranged in a direction away from the base substrate 00, and the pixel circuit 302, the auxiliary electrode 305, the connecting electrode 301 and the light-emitting layer 303 of the dummy sub-pixel 30 may be electrically connected in sequence.

Furthermore, in order to further implement the reliable electrical connection between the pixel circuit 302 and the light-emitting layer 303, the orthographic projection of the auxiliary electrode 305 on the base substrate 00 may at least partially overlap with the orthographic projection of the connecting electrode 301 on the base substrate 00. For example, the orthographic projection of the auxiliary electrode 305 included in the array substrate in FIG. 12 on the base substrate 00 completely covers the orthographic projection of the connecting electrode 301 on the base substrate 00. By means of complete covering, the reliable electrical connection between the auxiliary electrode 305 and the connecting electrode 301 is ensured, and thus the reliable electrical connection between the pixel circuit 302 and the light-emitting layer 303 is ensured.

Optionally, referring to FIG. 12, in the embodiment of the present disclosure, the auxiliary electrode 305 may further be located on the same layer with a source & drain (SD) in the pixel circuit 302 of the dummy sub-pixel 30. Correspondingly, the auxiliary electrode 305 and the SD of the pixel circuit 302 may be formed by the single patterning process, such that the increase of the manufacturing cost and the complexity of the manufacturing process are prevented.

Optionally, referring to FIG. 12, the array substrate may further include: a buffer layer B1, an active layer (poly) L1, a first gate insulating layer GI1, a gate G1 and a second gate insulating layer GI2 that are located between the base substrate 00 and the SD and are sequentially stacked in the direction away from the base substrate, a planarization layer (PLN) N1 located between the SD and the connecting electrode 301, a Pixel Definition Layer (PDL) D1 and a Hole Transport Layer (HTL) H1 located between the connecting electrode 301 and the light-emitting layer 303 and sequentially arranged along a Y1 direction, and an Electron Transport Layer (ETL) E1 located between the light-emitting layer 303 and the electrode layer 304.

Figure 13:
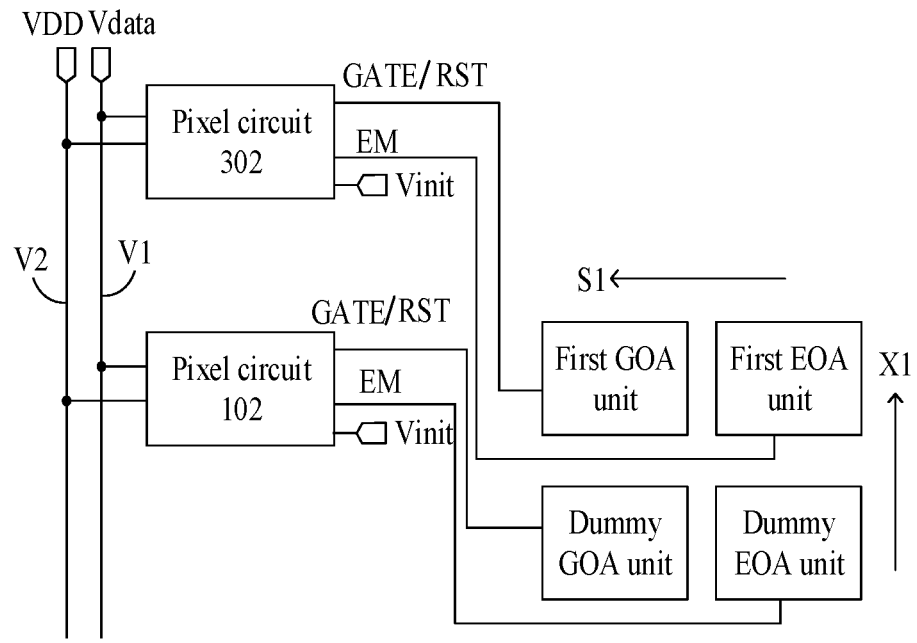
FIG. 13 is a schematic structural diagram of still another array substrate provided by an embodiment of the present disclosure.
Figure 14:
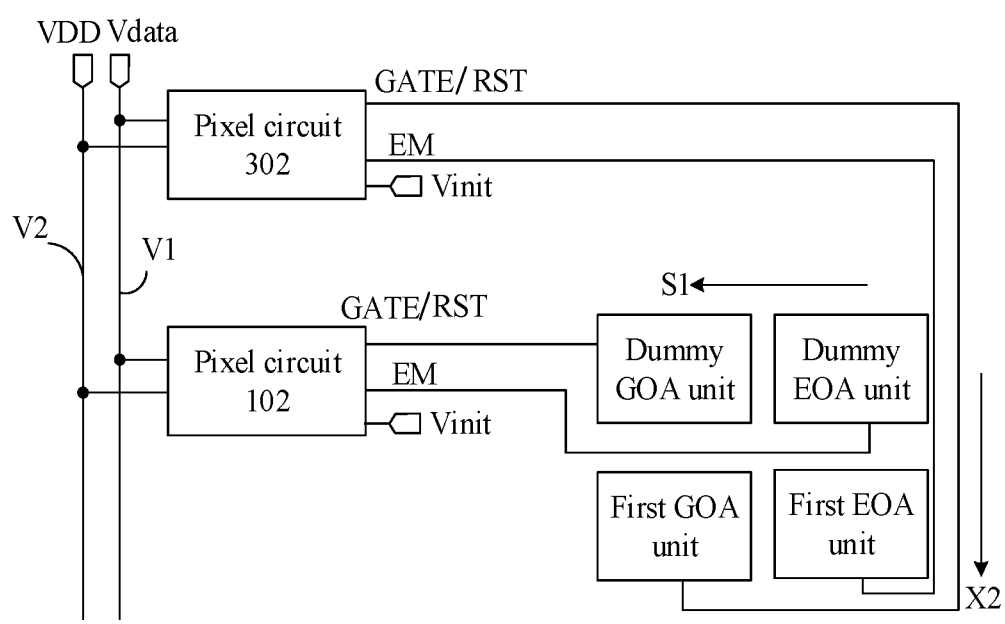
FIG. 14 is a schematic structural diagram of still another array substrate provided by an embodiment of the present disclosure.

FIG. 13 is a schematic structural diagram of still another array substrate provided by an embodiment of the present disclosure. FIG. 14 is a schematic structural diagram of still another array substrate provided by an embodiment of the present disclosure. Referring to FIG. 13 and FIG. 14, and the sectional view of FIG. 12, it can be seen that the array substrate may further include: a data line V1 (connected to the data signal end Vdata), a power signal line V2 (connected to the power signal end VDD), a first GOA unit and a first EOA unit. Moreover, referring to FIG. 13 and FIG. 14, the data line V1, the power signal line V2, the first GOA unit and the first EOA unit may be all electrically connected to the pixel circuit 302 of the dummy sub-pixel 30.

For example, referring to FIG. 13 and FIG. 14, the first GOA unit may be connected to a gate signal end GATE and a reset signal end RST of the pixel circuit 302, and the first EOA unit may be connected to a light-emitting control signal end EM of the pixel circuit 302. The data line V1 may provide a data signal for the pixel circuit 302 of the dummy sub-pixel 30, the power signal line V2 may provide a power signal for the pixel circuit 302 of the dummy sub-pixel 30, the first GOA unit may provide a gate drive signal GATE and a reset signal RST for the pixel circuit 302 of the dummy sub-pixel 30, and the first EOA unit may provide a light-emitting control signal EM for the pixel circuit 302 of the dummy sub-pixel 30. The pixel circuit 302 may work under the driving of each signal, thereby driving the light-emitting layer 303 of the dummy, sub-pixel 30 to emit light. Optionally, referring to FIG. 13 and FIG. 14, each pixel circuit is further electrically connected to an initial power end Vinit, and the initial power end Vinit may provide an initial power signal for the electrically connected pixel circuit.

It is to be noted that both the data line V1 and the power signal line V2 may be located on the same layer with the SD in combination with FIG. 12. Correspondingly, the data line V1 and the power signal line V2 as well as the SD may be formed by the single patterning process.

Referring to FIG. 13 and FIG. 14, the array substrate may further include: a dummy GOA unit and a dummy EOA unit, both the dummy GOA unit and the dummy EOA unit may be electrically connected to the pixel circuit 102 of the first sub-pixel 10, and the first sub-pixel 10 and the dummy sub-pixel 30 may be sequentially arranged along the target direction X1 and are adjacent.

Optionally, referring to FIG. 13, the first EOA unit, the first GOA unit and the first sub-pixel 10 may be sequentially arranged along a gate line scanning direction S1, the dummy GOA unit and the first GOA unit may be sequentially arranged along the target direction X1, and the dummy EOA unit and the first EOA unit may be sequentially arranged along the target direction X1.

Or, referring to FIG. 14, the dummy EOA unit, the dummy GOA unit and the first sub-pixel 10 may be sequentially arranged along the gate line scanning direction S1, the dummy GOA unit and the first GOA unit may be sequentially arranged along a reverse direction X2 of the target direction and the dummy EOA unit and the first EOA unit may be sequentially arranged along the reverse direction X2 of the target direction X1. It is to be noted that FIG. 13 and FIG. 14 only illustrate the pixel circuit 102 of the first sub-pixel 10, and the pixel circuit 302 of the dummy sub-pixel 30.

Comparing the arrangement manner and connection manner in FIG. 13 and FIG. 14, it can be seen that the use of the arrangement manner and connection manner shown in FIG. 13 may reduce the wiring length, facilitate the connection between the first GOA unit and the first EOA unit and the pixel circuit 302 of the dummy sub-pixel. 30, save the manufacturing cost and help the implementation of the narrow bezel.

Figure 15:
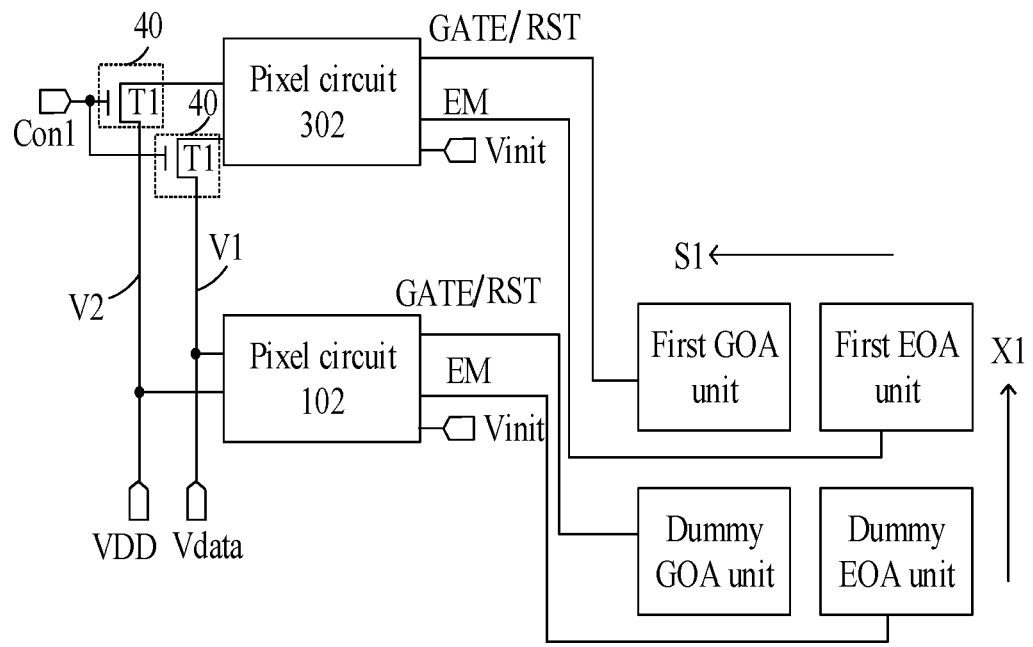
FIG. 15 is a schematic structural diagram of still another array substrate provided by an embodiment of the present disclosure.

Optionally, FIG. 15 is a schematic structural diagram of still another array substrate provided by an embodiment of the present disclosure. As shown in FIG. 15, the array substrate may further include: at least one switch circuit 40 in one-to-one correspondence with at least one signal line in a signal line set. Each signal line in the at least one signal line may include two conductive segments, and the two conductive segments may be electrically connected through a switch circuit 40 corresponding to the signal line.

Optionally, the signal line set may include: the data line V1, the power signal line V2, a signal line which electrically connects the first GOA unit and the pixel circuit 302 of the dummy, sub-pixel 30, and a signal line which electrically connects the first EOA unit and the pixel circuit 302 of the dummy sub-pixel 30. The switch circuit 40 may further be electrically connected to a control signal end Con1, and in response to a control signal provided by the control signal end Con1, the switch circuit 40 may control an on-off state of the two conductive segments that are electrically connected by the switch circuit.

Exemplarily, referring to FIG. 15, the at least one switch circuit 40 may include: a switch circuit 40 corresponding to the data line V1, and a switch circuit 40 corresponding to the power signal line V2. The switch circuit 40 corresponding to the data line V1 may control the two conductive segments of the data line V1 to be on, when the potential of the control signal provided by the control signal end Con1 is the effective potential. At this time, the data line V1 may input the data signal to the pixel circuit 302. When the potential of the control signal is the ineffective potential, the switch circuit 40 corresponding to the data line V1 controls the two conductive segments of the data line V1 to be disconnected. The switch circuit 40 corresponding to the power signal line V2 may control the two conductive segments of the power signal line V2 to be on, when the potential of the control signal provided by the control signal end Con1 is the effective potential. At this time, the power signal line V2 may input the power signal to the pixel circuit 302. When the potential of the control signal is the ineffective potential, the switch circuit 40 corresponding to the power signal line V2 controls the two conductive segments of the power signal line V2 to be disconnected.

By providing the switch circuits 40, the pixel circuit 302 of the dummy sub-pixel 30 may be flexibly controlled. Besides, since the signal provided by the first GOA unit for the pixel circuit 302 is the gate drive signal and the signal provided by the first EOA unit for the pixel circuit 302 is the light-emitting control signal, and both the gate drive signal and the light-emitting control signal tend to cause an electric leakage in a floating state, a flexible control of the pixel circuit 302 may be realized by only providing the switch circuits corresponding to the data line V1 and the power signal line V2, and the phenomenon of abnormal display effect due to the electric leakage of the gate drive signal and the light-emitting control signal may be prevented. That is, the display effect is ensured on the premise of the controllability for the pixel circuit 302 of the dummy sub-pixel 30.

Optionally, referring to FIG. 15, the switch circuit 40 may include a transistor T1. A gate of the transistor T1 may be electrically connected to the control signal end Con1, a first pole of the transistor T1 may be electrically connected to one conductive segment of one signal line, and a second pole of the transistor T1 may be electrically connected to the other conductive segment of the signal line.

Exemplarily, referring to FIG. 15, the gate of the transistor T1 corresponding to the data line V1 is electrically connected to the control signal end Con1, the first pole of the transistor T1 is electrically connected to one conductive segment of the data line V1, and the second pole of the transistor T1 is electrically connected to the other conductive segment of the data line V1. The gate of the transistor T1 corresponding to the power signal line V2 is electrically connected to the control signal end Con1, the first pole of the transistor T1 is electrically connected to one conductive segment of the power signal line V2, and the second pole of the transistor T1 is electrically connected to the other conductive segment of the power signal line V2.

Figure 16:
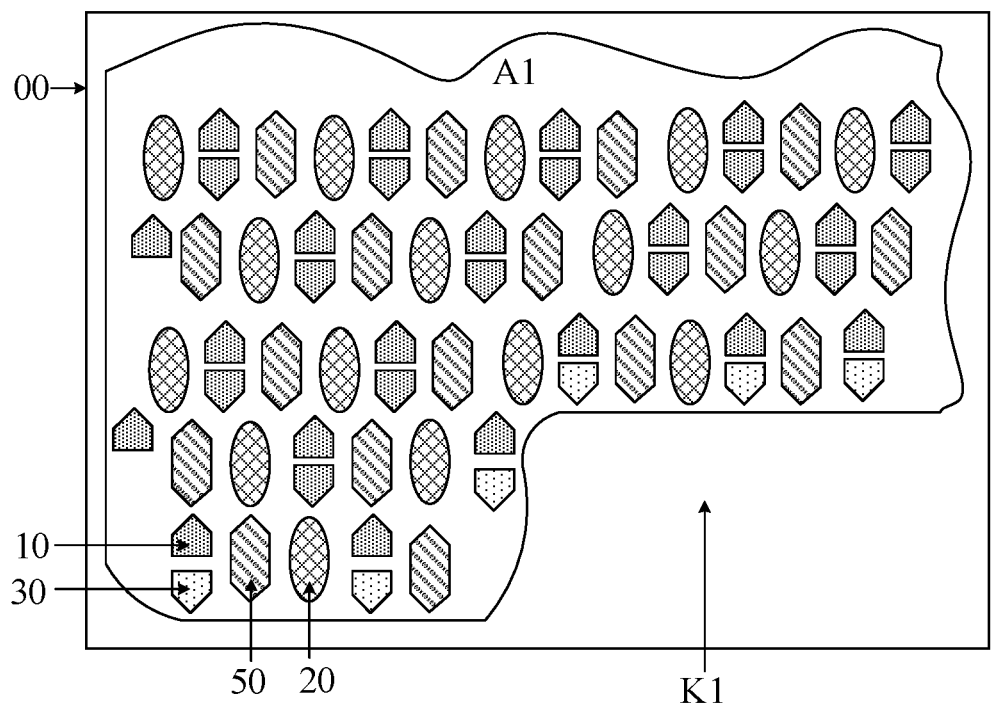
FIG. 16 is a schematic structural diagram of still another array substrate provided by an embodiment of the present disclosure.

Optionally, FIG. 16 is a schematic structural diagram of still another array substrate provided by an embodiment of the present disclosure. As shown in FIG. 16, the array substrate may further include a third sub-pixel 50 located in the display region A1. The first sub-pixel 10, the second sub-pixel 20 and the third sub-pixel 50 may be different in color. Two sub-pixels for emitting light of a target color are arranged side by side between the second sub-pixel 20 and the third sub-pixel 50 in the gate line scanning direction S1, and the target color is the same as the color of the light emitted by the first sub-pixel.

As the light emitted by the dummy sub-pixel 30 and the first sub-pixel 10 is the same in color, referring to FIG. 16, two first sub-pixels 10 may be arranged side by side between the second sub-pixel 20 and the third sub-pixel 50; or, one first sub-pixel 10 and one dummy sub-pixel 30 may be arranged side by side between the second sub-pixel 20 and the third sub-pixel 50.

With the arrangement manner shown in FIG. 16, the second sub-pixel 20 and the third sub-pixel 50 may implement normal color matching by sharing the two sub-pixels arranged side by side therebetween. That is, the normal display is implemented by sharing the sub-pixels. Optionally, the first sub-pixel 10 may be a green sub-pixel, the second sub-pixel 20 may be a red sub-pixel, and the third sub-pixel 50 may be a blue sub-pixel.

Certainly, the colors of the first sub-pixel 10, the second sub-pixel 20 and the third sub-pixel 50 are not limited to the description in the specification, i.e., for other display apparatuses not in the RGB arrangement; the luminance may further be effectively compensated through the array substrate provided by the embodiment of the present disclosure.

It is to be noted that all the structures (such as the connecting electrode, the pixel circuit and the light-emitting layer) included in each sub-pixel are required to be manufactured by the patterning process and a Fine Metal Mask (FMM). As the structure of the effective sub-pixel is not adjusted in the embodiment of the present disclosure, the change on the hollow-out region of the effective sub-pixel portion corresponding to the FMM is unnecessary in the embodiment of the present disclosure.

It is further to be noted that the electrical connection described in the embodiment of the present disclosure refers to that two interconnected ends may transmit the signal to each other, and the electrical connection may include direct connection or indirect connection. The above embodiments take that the transistor uses the N-type transistor, the effective potential is the high potential and the ineffective potential is the low potential as the example for description. Certainly, the transistor may further use the P-type transistor. When the transistor uses the P-type transistor, the effective potential is the low potential, and the ineffective potential is the high potential.

In conclusion, the embodiment of the present disclosure provides the array substrate including the first sub-pixel, the second sub-pixel and the dummy sub-pixel. The luminance attenuation degree of the first sub-pixel is greater than that of the second sub-pixel in the target direction, and the light emitted by the light-emitting layer of the dummy sub-pixel has the same color as that of the light emitted by the first sub-pixel. The dummy sub-pixel further includes the connecting electrode for electrically connecting the pixel circuit with the light-emitting layer of the dummy sub-pixel, and the pixel circuit may drive the dummy sub-pixel to emit light by the connecting electrode. Therefore, the luminance attenuation of the first sub-pixel may be compensated by controlling the dummy sub-pixel to emit light, i.e., the difference in luminance attenuation between the first sub-pixel and the second sub-pixel may be reduced by controlling the dummy sub-pixel to emit light. The display apparatus having the array substrate has the better display effect.

FIG. 17 is a flowchart of a method for manufacturing an array substrate provided by an embodiment of the present disclosure, which is used to manufacture the array substrate shown in any of FIG. 10 to FIG. 16. Referring to FIG. 17, the manufacturing method may include the following step.

In step 170: a pixel circuit structure, a drive electrode structure, a light-emitting layer structure and an electrode layer structure are sequentially formed in a display region of a base substrate to obtain a first sub-pixel, a second sub-pixel and a dummy sub-pixel.

The pixel circuit structure may include a pixel circuit of each sub-pixel, the drive electrode structure may include a connecting electrode of each sub-pixel, the light-emitting layer structure may include a light-emitting layer of each sub-pixel, and the electrode layer structure may include an electrode layer of each sub-pixel. In each sub-pixel, the light-emitting layer may be electrically connected to the pixel circuit through the connecting electrode, the light-emitting layer may further be electrically connected to the electrode layer, and the pixel circuit may drive the light-emitting layer to emit light by the connecting electrode.

In the embodiment of the present disclosure, referring to FIG. 10, the display region A1 is provided with a notch K1, a luminance attenuation degree of the first sub-pixel 10 is greater than that of the second sub-pixel 20 along a target direction X1 from a center of the display region A1 to a place close to the notch K1; and a light-emitting layer of the dummy sub-pixel and a light-emitting layer of the first sub-pixel are configured to emit light having the same color.

In conclusion, the embodiment of the present disclosure provides the method for manufacturing the array substrate. The dummy sub-pixel is formed in the display region and the dummy sub-pixel includes the connecting electrode and emits the light having the same color as that of the light emitted by the first sub-pixel which has the largest luminance attenuation degree. The luminance attenuation of the first sub-pixel may be compensated by controlling the dummy sub-pixel to emit light, i.e., the difference in luminance attenuation between the first sub-pixel and the second sub-pixel may be reduced by controlling the dummy sub-pixel to emit light. The display apparatus corresponding to the array substrate manufactured by the method for manufacturing the array substrate has the better display effect.

Optionally, referring to FIG. 12, the array substrate may further include an auxiliary electrode 305. Correspondingly, FIG. 18 is a flowchart of a method for sequentially forming a pixel circuit structure, a drive electrode circuit, a light-emitting layer structure and an electrode layer structure in a display region of a base substrate provided by an embodiment of the present disclosure. As shown in FIG. 18, the method may include the following steps:

In step 1701, a gate pattern, an active layer pattern and an SD pattern are formed on a side of the base substrate to obtain the pixel circuit structure:

In the embodiment of the present disclosure, the active layer pattern, the gate pattern and the SD pattern may be sequentially formed by the patterning process in a direction away from the base substrate 00. The pixel circuit structure obtained with the method is of a bottom-gate structure. Or, the active layer pattern, the SD pattern and the gate pattern are sequentially formed by the patterning process in the direction away from the base substrate 00. The pixel circuit structure obtained with the method is of a top-gate structure. Optionally, the patterning process may include gluing, exposure, developing, etching, etc.

Figure 19:
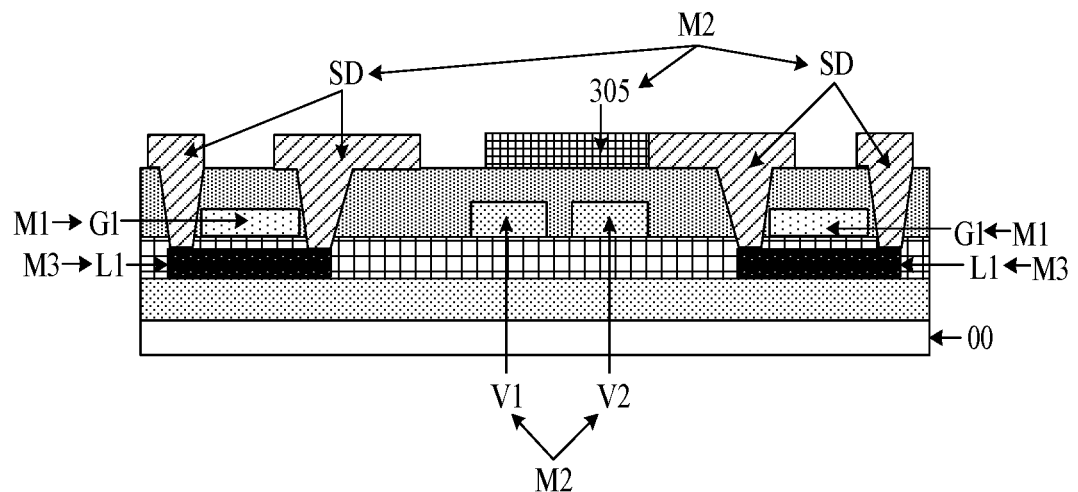
FIG. 19 is a schematic diagram of an array substrate having a formed pixel circuit structure provided by an embodiment of the present disclosure.

Exemplarily, the base substrate 00 having a formed pixel circuit structure may be as illustrated in FIG. 19. Referring to FIG. 19, the illustrated pixel circuit structure is the bottom-gate structure, i.e., the gate pattern M1 and the SD pattern M2 are sequentially arranged along the direction away from the base substrate 00. The gate pattern M1 may include the gate G1 of each to-be-formed sub-pixel (such as the first sub-pixel 10, the second sub-pixel 20 and the dummy sub-pixel 30), the SD pattern M2 may include the SD of each to-be-formed sub-pixel and the auxiliary electrode 305, and the active layer pattern M3 may include the active layer L1 of each to-be-formed sub-pixel.

Optionally, referring to FIG. 19, the SD pattern M2 may further include the data line V1 shown in any of FIG. 12 to FIG. 15, the power signal line V2 and the SD of the switch circuit 40 (not shown in the figure). The gate pattern M1 may further include the gate (not shown in the figure) of the switch circuit 40 shown in FIG. 10.

It is to be noted that FIG. 19 merely illustrates the gate pattern, SD pattern and active layer pattern corresponding to the to-be-formed first sub-pixel 10 and the dummy sub-pixel 30.

In step 1702: the drive electrode structure is formed on a side away from the base substrate, of the gate pattern, the active layer pattern and the SD pattern.

In the embodiment of the present disclosure, upon the formation of the pixel circuit, the patterning process may be used continuously to form the drive electrode structure on the side away from the base substrate of the gate pattern, the active layer pattern and the SD pattern.

Figure 20:
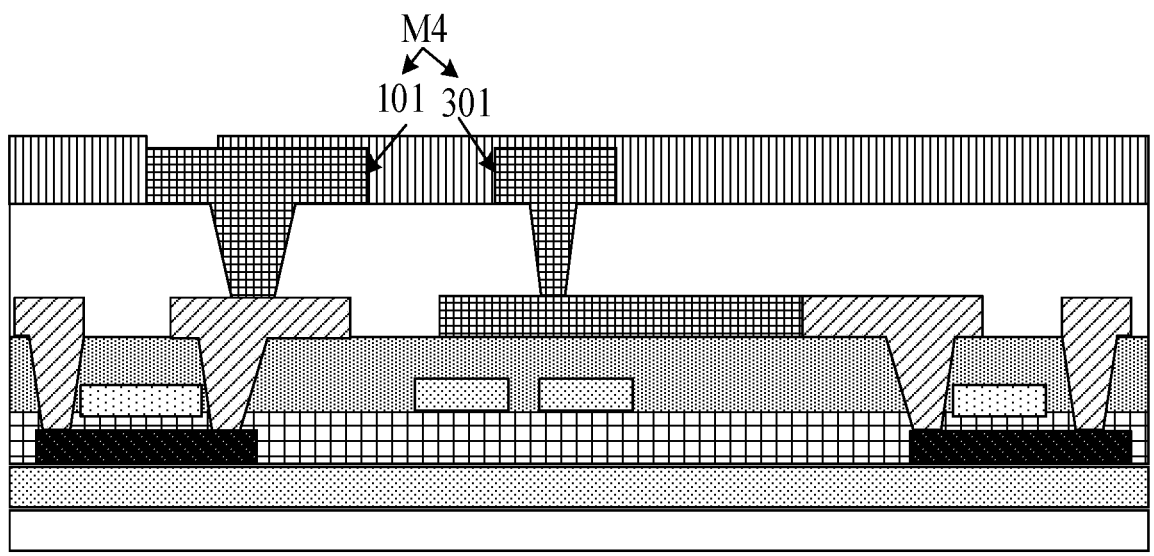
FIG. 20 is a schematic diagram of an array substrate having a formed drive electrode structure provided by an embodiment of the present disclosure.

Exemplarily, the base substrate 00 having a formed drive electrode structure M4 may be as illustrated in FIG. 20. Referring to FIG. 20, the drive electrode pattern M4 may include the connecting electrode of each to-be-formed sub-pixel. FIG. 14 merely illustrates the connecting electrode 101 of the to-be-formed first sub-pixel 10 and the connecting electrode 301 of the to-be-formed dummy sub-pixel 30. Optionally, the formed drive electrode structure may be the anode or the cathode.

It is to be noted that the exposure step of the patterning process provided by the embodiment of the present disclosure is executed by using the mask including different shapes and sizes of hollow-out regions. For the dummy sub-pixel 30, the area of the orthographic projection of the formed connecting electrode 301 on the base substrate 00 may be smaller than or equal to that of the orthographic projection of the light-emitting layer 303 on the base substrate 00, such that the area of the hollow-out region corresponding to the connecting electrode 301 of the mask may be smaller than or equal to the area of the hollow-out region corresponding to the light-emitting layer 303.

In step 1703, the light-emitting layer structure is formed on a side of the drive electrode structure away from the base substrate.

Likewise, the patterning process may be used continuously to form the light-emitting layer structure M5 on the side of the drive electrode structure M4 away from the base substrate 00.

Figure 21:
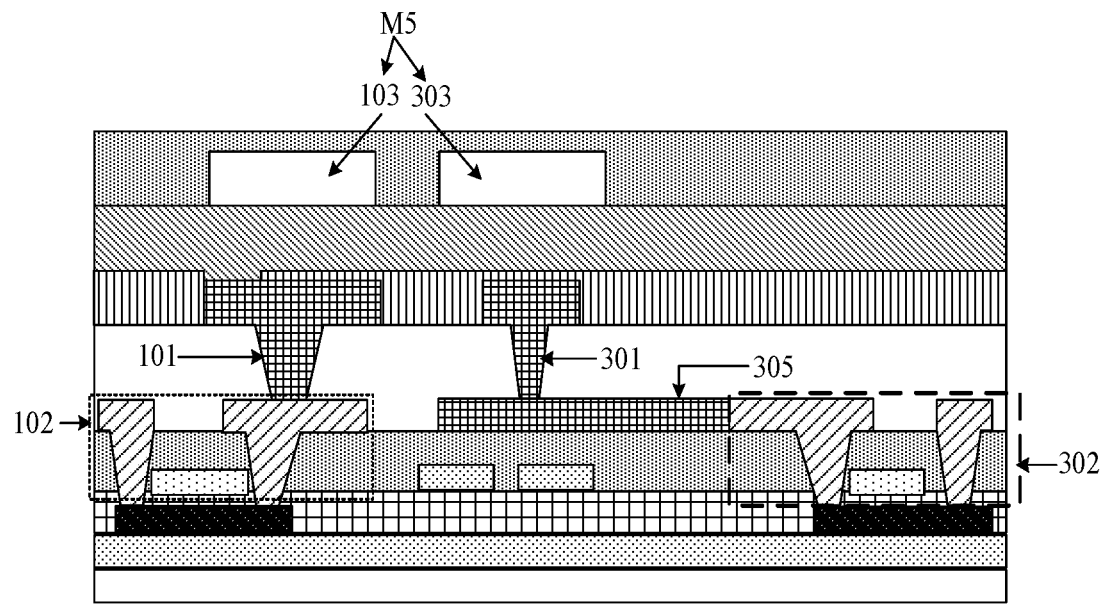
FIG. 21 is a schematic diagram of an array substrate having a formed light-emitting layer structure provided by an embodiment of the present disclosure.

Exemplarily, the base substrate 00 having a formed light-emitting layer structure M5 may be as illustrated in FIG. 21. Referring to FIG. 21, the light-emitting layer pattern structure may include the light-emitting layer of each to-be-formed sub-pixel. For example, FIG. 21 merely illustrates the light-emitting layer 103 of the to-be-formed first sub-pixel, and the light-emitting layer 303 of the to-be-formed dummy sub-pixel. Moreover, referring to FIG. 21, the pixel circuit 302 and the light-emitting layer 303 of the dummy sub-pixel may be electrically connected through the connecting electrode 301, and the pixel circuit 102 and the light-emitting layer 103 of the first sub-pixel may be electrically connected through the connecting electrode 101.

Optionally, the materials for forming the light-emitting layers corresponding to different sub-pixels may be different. For example, when the first sub-pixel 10 is the green sub-pixel and the dummy sub-pixel 30 is the green dummy sub-pixel, the material of the light-emitting layer structure M5 may be the light-emitting material for forming the green sub-pixel.

In step 1704, the electrode layer structure is formed on a side of the light-emitting layer structure away from the base substrate.

Likewise, the patterning process may be used continuously to form the electrode layer structure M6 on the side of the light-emitting layer structure M5 away from the base substrate 00.

Figure 22:
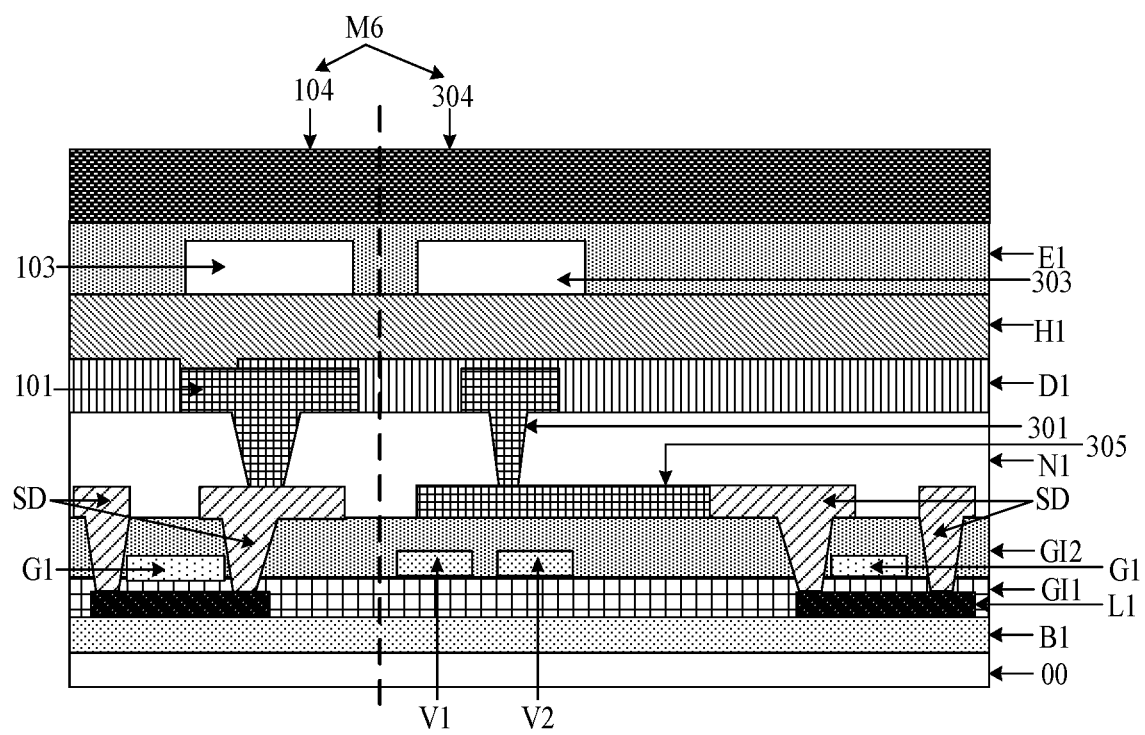
FIG. 22 is a schematic diagram of an array substrate having a formed electrode layer structure provided by an embodiment of the present disclosure.

Exemplarily, the base substrate 00 having a formed electrode layer structure M6 may be as illustrated in FIG. 22. Referring to 22, the electrode layer structure M6 may include an electrode layer of each sub-pixel (FIG. 22 merely illustrates the electrode layer 104 of the first sub-pixel and the electrode layer 304 of the dummy sub-pixel). Optionally, the formed electrode layer may be the anode or the cathode, and the electrodes corresponding to the electrode layer structure and the drive electrode structure are different.

It is to be noted that in combination with FIG. 19 to FIG. 22, for the array substrate of the bottom-gate structure, the method for forming the sub-pixel further includes that: a buffer B is first formed on one side of the base substrate 00 by the patterning process before the active layer L1 is formed; upon the formation of the active layer L1, a first gate insulating layer GI1 is formed on a side of the active layer L1 away from the buffer B1; upon the formation of the gate G1, a second gate insulating layer GI2 is formed on a side of the gate G1 away from the first gate insulating layer GI1; upon the formation of the SD, a planarization layer N1 is formed on a side of the SD away from the base substrate 00; upon the formation of the drive electrode structure (including the connecting electrode), a PDL D1 is formed on a side of the drive electrode structure away from the planarization layer N1; an HTL H1 is formed on a side of the PDL D1 away from the drive electrode structure; and upon the formation of the light-emitting layer structure (including the light-emitting layer), an ETL E1 is formed on a side of the light-emitting layer structure away from the HTL H1.

It is further to be noted that a first GOA unit, a first EOA unit, a dummy GOA unit and a dummy EOA unit may further be disposed at the edge of the base substrate. Each GOA unit and each EOA unit are electrically connected to the pixel circuit of the sub-pixel so as to control the pixel circuit to drive the electrically connected sub-pixel to emit light.

In conclusion, the embodiment of the present disclosure provides the method for manufacturing the array substrate. The dummy sub-pixel is formed in the display region and the dummy sub-pixel includes the connecting electrode and emits the light having the same color as that of the light emitted by the first sub-pixel which has the largest luminance attenuation degree. The luminance attenuation of the first sub-pixel may be compensated by controlling the dummy sub-pixel to emit light, i.e., the difference in luminance attenuation between the first sub-pixel and the second sub-pixel may be reduced by controlling the dummy sub-pixel to emit light. The display apparatus corresponding to the array substrate manufactured by the method for manufacturing the array substrate has the better display effect.

FIG. 23 is a flowchart of a method for driving an array substrate provided by an embodiment of the present disclosure, which is used to drive the array substrate shown in any of FIG. 10 to FIG. 16. As shown in FIG. 23, the method may include the following step.

In step 230, a drive signal is provided for a pixel circuit of a dummy sub-pixel, the pixel circuit of the dummy sub-pixel drives a light-emitting layer of the dummy sub-pixel to emit light by a connecting electrode of the dummy sub-pixel in response to the drive signal.

Optionally, referring to FIG. 15, the array substrate may further include at least one switch circuit 40 in one-to-one correspondence with at least one signal line in a signal line set; and the switch circuit 40 is further electrically connected to a control signal end Con1. Correspondingly, referring to FIG. 24, step 230 may include the following steps.

In step 2301: a control signal is provided for the control signal end, and in response to the control signal, the switch circuit controls two conductive segments electrically connected to the switch circuit to be on.

In the embodiment of the present disclosure, the apparatus for controlling the array substrate may first provide the control signal in an effective potential for the control signal end; and correspondingly, the switch circuit may control, under the control of the control signal, the two conductive segments electrically connected to the control circuit to be on.

For example, for the array substrate shown in FIG. 15, one switch circuit 40 may control, under the control of the control signal, two conductive segments of the data line V1 electrically connected to the switch circuit 40 to be on; and the other switch circuit 40 may control, under the control of the control signal, the power signal line V2 electrically connected to the switch circuit 40 to be on.

In step 2302: a data signal is provided for a data line, a power signal is provided for a power signal line, a compensation signal is provided for a first GOA unit, and a compensation signal is provided for a first EOA unit.

In the embodiment of the present disclosure, after the control signal in the effective potential is provided for the control signal end Con1, the control apparatus may control the circuit (such as the source drive circuit) connected to the data line V1 to provide the data signal for the data line V1. The control apparatus may control the circuit connected to the power signal line V2 to provide the power signal for the power signal line V2. The control apparatus may control the circuit connected to the first GOA unit to provide the compensation signal for the dummy GOA unit, and may control the circuit connected to the first EOA unit to provide the compensation signal for the dummy EOA unit.

Then, the data line V1 may write the data signal into the pixel circuit, the power signal line V2 may write the power signal into the pixel circuit 302, the first GOA unit may output the gate drive signal and the reset signal to the pixel circuit 302, and the first EOA unit may output the light-emitting control signal to the pixel circuit 302. Correspondingly, the pixel circuit 302 may output, under the control of a plurality of signals, the drive signal to the light-emitting layer 303 to which the pixel circuit 302 is electrically connected to drive the electrically connected light-emitting layer 303 to which the pixel circuit 302 is electrically connected to emit light.

It is to be noted that the chronological sequences of step 2301 and step 2302 are not limited in the embodiment of the present disclosure. For example, step 2301 and step 2302 may be executed synchronously.

In conclusion, the embodiment of the present disclosure provides the method for controlling the array substrate. By providing the signal for each signal line, first GOA unit and first EOA unit, the pixel circuit of the dummy sub-pixel may reliably drive the light-emitting layer of the dummy sub-pixel to emit light. As the dummy sub-pixel may emit light having the same color as the light emitted by the first sub-pixel having the largest luminance attenuation degree, the difference in luminance attenuation between the first sub-pixel and the second sub-pixel may be effectively reduced by controlling the dummy sub-pixel to emit light. The display apparatus corresponding to the array substrate manufactured with the array substrate has the better display effect.

Optionally, an embodiment of the present disclosure further provides an apparatus for controlling an array substrate; the control apparatus may be electrically connected to a pixel circuit of a dummy sub-pixel; and the control apparatus may execute the method for driving the array substrate shown in either FIG. 23 or FIG. 24. For example, the control apparatus may be a processor.

Optionally, an embodiment of the present disclosure further provides a display apparatus. The display apparatus may include the array substrate shown in any of FIG. 10 to FIG. 16, and the apparatus for controlling the array substrate. The display apparatus may be any product or component having a display function, such as a liquid crystal display panel, electronic paper, an Organic Light-Emitting Diode (OLED) panel, an Active-Matrix Organic Light-Emitting Diode (AMOLED) panel, a mobile phone, a tablet computer, a television, a display, a notebook computer, and a digital photo frame.

It will be apparent to those skilled in the art that the specific operations of the described array substrate, circuit and apparatus for controlling the array substrate may be referred to the corresponding process in the aforementioned method embodiments for the sake of convenience and conciseness of the description and will not be described again here.

The descriptions above are only optional embodiments of the present disclosure, but are not intended to limit the present disclosure; and any modifications, equivalent substitutions, improvements and the like made within the spirits and principles of the present disclosure are all included in the protection scope of the present disclosure.

What is claimed is:

1. An array substrate, comprising a base substrate, and a first sub-pixel, a second sub-pixel and a dummy sub-pixel that are located in a display region of the base substrate, wherein the display region is provided with a notch, and a luminance attenuation degree of the first sub-pixel is greater than that of the second sub-pixel in a target direction from a center of the display region to a place close to the notch; and each sub-pixel comprises a pixel circuit, a connecting electrode, a light-emitting layer and an electrode layer; the light-emitting layer is electrically connected to the pixel circuit through the connecting electrode; the light-emitting layer is further electrically connected to the electrode layer; the pixel circuit is configured to drive the light-emitting layer to emit light through the connecting electrode; and a light-emitting layer in the dummy sub-pixel and a light-emitting layer in the first sub-pixel are configured to emit light having a same color; and wherein a ratio of an area of an orthographic projection of the connecting electrode on the base substrate to an area of an orthographic projection of the light-emitting layer on the base substrate ranges from 7% to 15% in the dummy sub-pixel.

2. The array substrate according to claim 1, wherein a connecting electrode of the dummy sub-pixel and a connecting electrode of the first sub-pixel are located on a same layer.

3. The array substrate according to claim 1, wherein the array substrate further comprises an auxiliary electrode, and the auxiliary electrode and the connecting electrode in the dummy sub-pixel are sequentially arranged along a direction away from the base substrate; and the pixel circuit of the dummy sub-pixel, the auxiliary electrode, the connecting electrode of the dummy sub-pixel, and the light-emitting layer of the dummy sub-pixel are electrically connected in sequence.

4. The array substrate according to claim 3, wherein the auxiliary electrode and source and drain electrodes in the pixel circuit of the dummy sub-pixel are located on a same layer.

5. The array substrate according to claim 1, wherein the array substrate further comprises: a data line, a power signal line, a first shift register Gate Driver on Array (GOA) unit and a first shift register Emission circuit on Array (EOA) unit;

the data line, the power signal line, the first GOA unit and the first EOA unit are all electrically connected to the pixel circuit of the dummy sub-pixel; and the data line is configured to provide a data signal for the pixel circuit of the dummy sub-pixel, the power signal line is configured to provide a power signal for the pixel circuit of the dummy sub-pixel, the first GOA unit is configured to provide a gate drive signal for the pixel circuit of the dummy sub-pixel, and the first EOA unit is configured to provide a light-emitting control signal for the pixel circuit of the dummy sub-pixel.

6. The array substrate according to claim 5, wherein the array substrate further comprises a dummy GOA unit and a dummy EOA unit, both the dummy GOA unit and the dummy EOA unit are electrically connected to a pixel circuit of the first sub-pixel, and the first sub-pixel and the dummy sub-pixel are sequentially arranged along the target direction and are adjacent; and the first EOA unit, the first GOA unit and the first sub-pixel are sequentially arranged along a gate line scanning direction, the dummy GOA unit and the first GOA unit are sequentially arranged along the target direction, and the dummy EOA unit and the first EOA unit are sequentially arranged along the target direction; or the dummy EOA unit, the dummy GOA unit and the first sub-pixel are sequentially arranged along the gate line scanning direction, the dummy GOA unit and the first GOA unit are sequentially arranged along a reverse direction of the target direction, and the dummy EOA unit and the first EOA unit are sequentially arranged along the reverse direction of the target direction.

7. The array substrate according to claim 5, wherein the array substrate further comprises at least one switch circuit in one-to-one correspondence with at least one signal line in a signal line set;

each signal line comprises two conductive segments, the two conductive segments are electrically connected through a switch circuit corresponding to the signal line, and the signal line set comprises the data line, the power signal line, a signal line electrically connecting the first GOA unit with the pixel circuit of the dummy sub-pixel, and a signal line electrically connecting the first EOA unit with the pixel circuit of the dummy sub-pixel; and the switch circuit is further electrically connected to a control signal end, and the switch circuit is configured to control an on-off state of each of the two conductive segments that are electrically connected to the switch circuit in response to a control signal provided by the control signal end.

8. The array substrate according to claim 7, wherein the at least one switch circuit comprises a switch circuit corresponding to the data line and a switch circuit corresponding to the power signal line.

9. The array substrate according to claim 7, wherein the switch circuit comprises a transistor; and a gate of the transistor is electrically connected to the control signal end, a first pole of the transistor is electrically connected to one conductive segment of one signal line, and a second pole of the transistor is electrically connected to the other conductive segment of the signal line.

10. The array substrate according to claim 1, wherein the array substrate further comprises a third sub-pixel located in the display region; and light emitted by the first sub-pixel, the second sub-pixel and the third sub-pixel is different in color, two sub-pixels for emitting light of a target color are arranged side by side between the second sub-pixel and the third sub-pixel in a gate line scanning direction, and the target color is the same as a color of the light emitted by the first sub-pixel.

11. The array substrate according to claim 10, wherein the first sub-pixel is a green sub-pixel, the second sub-pixel is a red sub-pixel, and the third sub-pixel is a blue sub-pixel.

12. A method for manufacturing an array substrate, comprising:
sequentially forming a pixel circuit structure, a drive electrode structure, a light-emitting layer structure and an electrode layer structure in a display region of a base substrate to obtain a first sub-pixel, a second sub-pixel and a dummy sub-pixel, wherein
the pixel circuit structure comprises a pixel circuit of each sub-pixel, the drive electrode structure comprises a connecting electrode of each sub-pixel, the light-emitting layer structure comprises a light-emitting layer of each sub-pixel, the electrode layer structure comprises an electrode layer of each sub-pixel, and in each sub-pixel, the light-emitting layer is electrically connected to the pixel electrode through the connecting electrode, the light-emitting layer is further electrically connected to the electrode layer, and the pixel circuit is configured to drive the light-emitting layer to emit light through the connecting electrode; and
the display region is provided with a notch; a luminance attenuation degree of the first sub-pixel is greater than that of the second sub-pixel in a target direction from a center of the display region to a place close to the notch; and a light-emitting layer of the dummy sub-pixel and a light-emitting layer of the first sub-pixel are configured to emit light having a same color; and
wherein a ratio of an area of an orthographic projection of the connecting electrode on the base substrate to an area of an orthographic projection of the light-emitting layer on the base substrate ranges from 7% to 15% in the dummy sub-pixel.

13. The method according to claim 12, wherein the array substrate further comprises an auxiliary electrode and the auxiliary electrode is electrically connected to the connecting electrode of the dummy sub-pixel; and sequentially forming the pixel circuit structure, the drive electrode structure, the light-emitting layer structure and the electrode layer structure in the display region of the base substrate comprises:
forming a gate pattern, an active layer pattern and a source and drain electrode pattern on a side of the base substrate to obtain the pixel circuit structure, wherein the source and drain electrode pattern comprises source and drain electrodes of each sub-pixel and the auxiliary electrode, the active layer pattern comprises an active layer of each sub-pixel, and the gate pattern comprises a gate of each sub-pixel;
forming the drive electrode structure on a side, away from the base substrate, of the gate pattern, the active layer pattern and the source and drain electrode pattern;
forming the light-emitting layer structure on a side of the drive electrode structure away from the base substrate; and
forming the electrode layer structure on a side of the light-emitting layer structure away from the base substrate.

14. A method for driving an array substrate according to claim 1, and comprising:
providing a drive signal for the pixel circuit of the dummy sub-pixel, wherein the pixel circuit of the dummy sub-pixel drives the light-emitting layer of the dummy sub-pixel to emit light through the connecting electrode of the dummy sub-pixel in response to the drive signal.

15. The method according to claim 14, wherein the array substrate further comprises at least one switch circuit in one-to-one correspondence with at least one signal line in a signal line set; the switch circuit is further electrically connected to a control signal end; and providing the drive signal for the pixel circuit of the dummy sub-pixel comprises:
providing a control signal for the control signal end, wherein the switch circuit controls two conductive segments electrically connected to the switch circuit to be on in response to the control signal; and
providing a data signal for a data line, providing a power signal for a power signal line, providing a compensation signal for a first Gate Driver on Array (GOA) unit, and providing a compensation signal for a first Emission circuit on Array (EOA) unit.

16. An apparatus for controlling an array substrate, wherein the control apparatus is electrically connected to a pixel circuit of a dummy sub-pixel, and the control apparatus is configured to execute the method for driving the array substrate according to claim 14.

17. A display apparatus, comprising the array substrate according to claim 1 and the apparatus for controlling the array substrate according to claim 16.

* * * * *